United States Patent
Kondo et al.

(10) Patent No.: US 6,943,397 B2
(45) Date of Patent: Sep. 13, 2005

(54) DEVICE HAVING CAPACITOR AND ITS MANUFACTURE

(75) Inventors: Masao Kondo, Kawasaki (JP); Hideki Yamawaki, Kawasaki (JP); Kenji Maruyama, Kawasaki (JP); Kazuaki Kurihara, Kawasaki (JP); Masaharu Hida, Kawasaki (JP); Shigeyoshi Umemiya, Kawasaki (JP); Masaki Kurasawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 105 days.

(21) Appl. No.: 10/647,246

(22) Filed: Aug. 26, 2003

(65) Prior Publication Data
US 2004/0043520 A1 Mar. 4, 2004

(30) Foreign Application Priority Data
Aug. 29, 2002 (JP) .................................. 2002-251264

(51) Int. Cl.$^7$ .............................................. H01L 29/76
(52) U.S. Cl. ...................... 257/310; 257/295; 257/532; 438/3
(58) Field of Search ......................... 438/3, 240, 310, 438/296, 253; 257/295, 306, 310, 532

(56) References Cited

U.S. PATENT DOCUMENTS

| 5,798,903 A | * | 8/1998 | Dhote et al. ............. 361/321.4 |
| 6,060,735 A | * | 5/2000 | Izuha et al. .................. 257/295 |
| 6,841,817 B2 | * | 1/2005 | Kurasawa et al. .......... 257/295 |
| 2002/0015852 A1 | * | 2/2002 | Noguchi et al. ............ 428/469 |

FOREIGN PATENT DOCUMENTS

JP    9-245525    9/1997

OTHER PUBLICATIONS

J.F. Scott, et al.; *Quantitative measurement of space–charge effects in lead zirconate–titanate memories*; Journal of Applied Physics, vol. 70, No. 1, Jul. 1, 1991, pp. 382–388 (Discussed on page 2 of specification).

* cited by examiner

Primary Examiner—Tuan H. Nguyen
(74) Attorney, Agent, or Firm—Westerman, Hattori, Daniels & Adrian, LLP

(57) ABSTRACT

A device having a capacitor element includes: an underlying body having a non-orientated first surface; a lower electrode formed on the first surface of the underlying body, the lower electrode containing conductive metal oxide and not containing noble metal, such as $LaNiO_3$, the conductive metal oxide having a (0 0 1) orientated $ABO_3$ type pervskite structure; a ferroelectric layer formed on the lower electrode, having a rhombohedral $ABO_3$ type pervskite structure, the ferroelectric layer being preferentially (0 0 1) orientated in conformity with the orientation of the lower electrode, and an upper electrode formed on the ferroelectric layer.

19 Claims, 7 Drawing Sheets

○ A
□ B
△ C
ABO$_3$

US 6,943,397 B2

DEVICE HAVING CAPACITOR AND ITS MANUFACTURE

CROSS REFERENCE TO RELATED APPLICATION

This application is based on and claims priority of Japanese Patent Application No. 2002-251264 filed on Aug. 29, 2002, the entire contents of which are incorporated herein by reference.

BACKGROUND OF THE INVENTION

A) Field of the Invention

The present invention relates to a device having a capacitor and its manufacture method, and more particularly to a device having a ferroelectric capacitor and its manufacture method.

B) Description of the Related Art

If a ferroelectric layer is used as the dielectric layer of a capacitor, polarization in the ferroelectric layer can be maintained even after voltage applied to the capacitor is removed. A nonvolatile memory can therefore be formed by a combination of ferroelectric capacitors and transistors for selectively applying voltage to each capacitor. Assuming that the same voltage is applied across opposing electrodes having a unit area, the larger the polarization in the ferroelectric layer, a nonvolatile memory having better retention characteristics can be obtained. An orientated ferroelectric layer has a larger polarization amount than a non-orientated ferroelectric layer so that the orientated ferroelectric layer is effective for improving the retention characteristics.

The surface of a transistor formed on a semiconductor substrate is covered with an insulating film made of silicon oxide or the like. The insulating film is generally of an amorphous phase or substantially an amorphous phase. A metal film such as a wiring layer formed on the insulating film takes a polycrystalline phase. A ferroelectric layer formed on the non-orientated surface of an amorphous phase or a polycrystalline phase will not be orientated.

Reports such as Journal of Applied Physics, 1991, vol. 70, no. 1, pp. 382 to 388 indicate that a platinum or iridium layer can be made to have a (1 1 1) orientation by heating it, even if the underlying layer is amorphous or polycrystalline. A ferroelectric layer formed on a (1 1 1) orientated metal layer can be made to have a (1 1 1) orientation. For example, there are experiments that a $PbZr_xTi_{1-x}O_3$ (PZT) film is formed on an underlying electrode of platinum or the like and made to have a (1 1 1) orientation.

It is known that if opposing electrodes sandwiching a ferroelectric layer of PZT or the like are made of noble metal such as platinum, the ferroelectric layer undergoes fatigue with time. It is also known that fatigue of a ferroelectric layer can be prevented if it is sandwiched between conductive metal oxide. In this context, there are experiments that after an orientation film of noble metal such as platinum is formed, a conductive metal oxide film is formed orientated in conformity with the orientation of the underlying surface, and on this conductive metal oxide film, an orientated ferroelectric film is formed.

The structure of such a ferroelectric capacitor is proposed in JP-A-HEI-9-245525. $LaNiO_3$ is disclosed as an example of the material of a conductive metal oxide film.

PZT and the like are known as the material of a ferroelectric layer having the chemical formula of an $ABO_3$ and a pervskite crystal structure.

FIG. 5A is a schematic diagram showing an $ABO_3$ type pervskite crystal structure. A unit cell is approximately represented by a cube. In FIG. 5A, an atom A represented by a circle is disposed on each corner of the cube. An atom B represented by a square is disposed at the body center of the cube. An atom O represented by a triangle is disposed at the center of each plane.

$PbZr_xTi_{1-x}O_3$ is tetragonal in the range of $0 \leq x < 0.52$, and rhombohedral in the range of $0.52 < x \leq 1$. The maximum axis ratio a/c of the tetragonal system is 1.07. Each axis of rhombohedral crystal is equal and an angle between axes is 89.9 to 90 degrees. Therefore, these tetragonal crystal and rhombohedral crystal are approximately cubic crystal, and will be described by approximating them to cubic crystal in the following.

The polarization axis of tetragonal PZT is <0 0 1>. The polarization amounts obtained by (1 1 1) and (0 0 1) orientated tetragonal PZT are shown in FIGS. 5B and 5C.

FIG. 5B shows the state of polarization in a (1 1 1) orientated PZT film. Since the polarization axis is <0 0 1>, polarization occurs in three <0 0 1> directions equivalent relative to a plane normal <1 1 1>. A contribution of polarization in the <0 0 1> direction upon the <1 1 1> direction is nearly $\cos(54.7°)=0.58$.

FIG. 5C shows the state of polarization in a (0 0 1) orientated PZT film. It is assumed that polarization occurs equivalently in three <0 0 1> directions. Polarization in one <0 0 1> direction occurs along a plane normal <0 0 1> so that the contribution of this polarization is 1. Polarizations in two other directions, i.e. along <1 0 0> and <0 1 0> directions are 0. An average contribution of the polarization in the direction <0 0 1> is therefore ⅓.

The effective contribution of the polarization of a (1 1 1) orientated film is 0.58 which is larger than the effective contribution of ⅓ of a (0 0 1) orientated film. Therefore, the (1 1 1) orientated film is used generally and the (0 0 1) orientated film is not. In order to realize the (1 1 1) orientation, expensive noble metal such as platinum is used as the material of a lower capacitor electrode.

SUMMARY OF THE INVENTION

An object of this invention is to provide a device having a capacitor element with large polarization and its manufacture method.

Another object of the invention is to provide a capacitor element with an orientated ferroelectric layer without using noble metal.

According to one aspect of the present invention, there is provided a device comprising: an underlying body having a non-orientated first surface; a lower electrode formed on the first surface of said underlying body, said lower electrode containing conductive metal oxide and not containing noble metal, the conductive metal oxide having a (0 0 1) orientated $ABO_3$ type pervskite structure; a ferroelectric layer formed on said lower electrode, having a rhombohedral $ABO_3$ type pervskite structure, said ferroelectric layer being orientated in conformity with the orientation of said lower electrode; and an upper electrode formed on said ferroelectric layer.

According to another aspect of the invention, there is provided a method of manufacturing a device having a capacitor element, comprising steps of: (a) forming a conductive metal oxide layer on an underlying body having a non-orientated surface, said conductive metal oxide layer having a (0 0 1) orientated $ABO_3$ type pervskite structure; (b) forming a ferroelectric layer on said conductive metal oxide layer, said ferroelectric layer having a (0 0 1) orientated rhombohedral ABO$_3$ type pervskite structure; and (c) forming an upper electrode on said ferroelectric layer.

Non-orientation corresponds to an amorphous state or a polycrystalline state without preferential orientation direction.

In this way, a ferroelectric capacitor having a large polarization amount can be manufactured at a low cost.

A ferroelectric nonvolatile memory having a large capacitance can be manufactured at a low cost.

DESCRIPTION OF THE PREFERRED EMBODIMENTS

The present inventors have found that LaNiO$_3$ can form a (0 0 1) orientated film even on the non-orientated surface of no preferential orientation direction. LaNiO$_3$ is conductive metal oxide having the chemical formula of an ABO$_3$ and a pervskite crystal structure. The inventors have found that an LaNiO$_3$ film can be uniaxially (0 0 1) orientated even on a non-orientated amorphous surface or on a non-orientated polycrystalline surface, if it is heated.

It has been confirmed that an LaNiO$_3$ film can be (0 0 1) orientated if it is subjected to a heating process, for example, at 650° C. Almost the same results were obtained through pulse laser deposition (PLD), laser ablation, and sol-gel method. If a temperature is too low, it is difficult to crystallize LaNiO$_3$. Crystallization has been confirmed at 550° C. on the low temperature side by the PLD method. Crystallization has been confirmed at up to 750° C. on the high temperature side by the sol-gel method. It is expected that crystallization is possible in the temperature range of 500° C. to 800° C. if the process conditions are adequately selected.

Figure 6A:
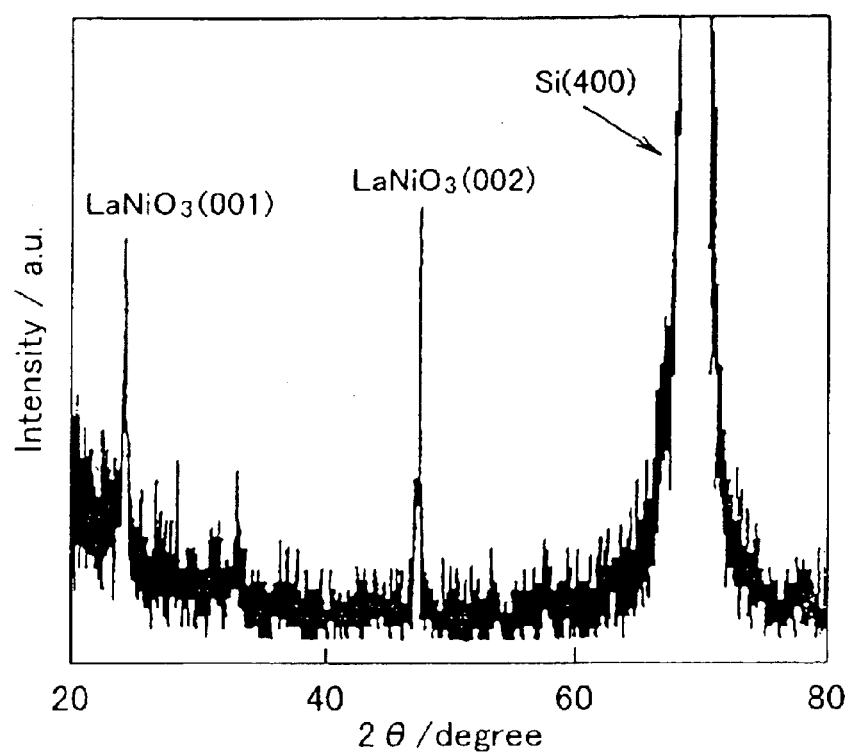
FIGS. 6A and 6B are graphs showing X-ray diffraction patterns of an LaNiO$_3$ film and an SrTiO$_3$ film.

FIG. 6A is a graph showing the X-ray diffraction pattern of an LaNiO$_3$ film formed by the laser ablation method.

The sample LaNiO$_3$ film was formed on a silicon substrate having a silicon oxide film of an amorphous phase by the laser ablation method. Although (0 0 1) and (0 0 2) diffraction peaks appear clearly, other diffraction peaks do not appear. It can be understood that the LaNiO$_3$ film is (0 0 1) orientated. Si (4 0 0) corresponds to a diffraction peak of the underlying Si substrate.

Not all ABO$_3$ type pervskite substances form such a (0 0 1) orientation.

Figure 6B:
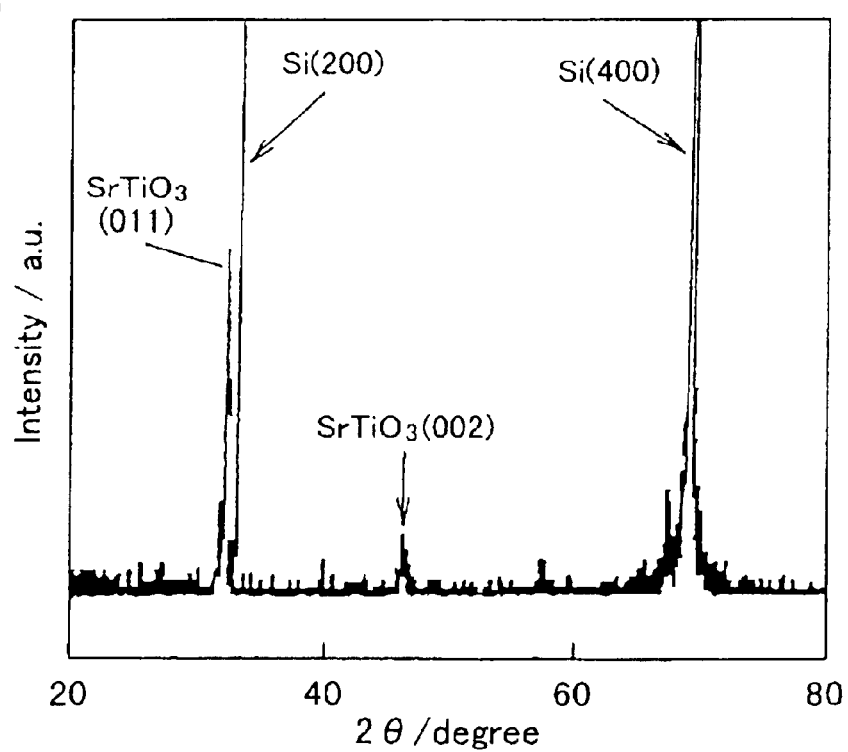

FIG. 6B is a graph showing the X-ray diffraction pattern of an SrTiO$_3$ film formed on a silicon oxide film of an amorphous phase. A diffraction peak (0 1 1) along with a diffraction peak (0 0 2) of SrTiO$_3$ appears. The intensity of the diffraction peak (0 1 1) is larger than that of the diffraction peak (0 0 2). The phase of this film can be considered as a mixed polycrystalline phase with (0 1 1) and (0 0 1) orientations.

Figure 5A:
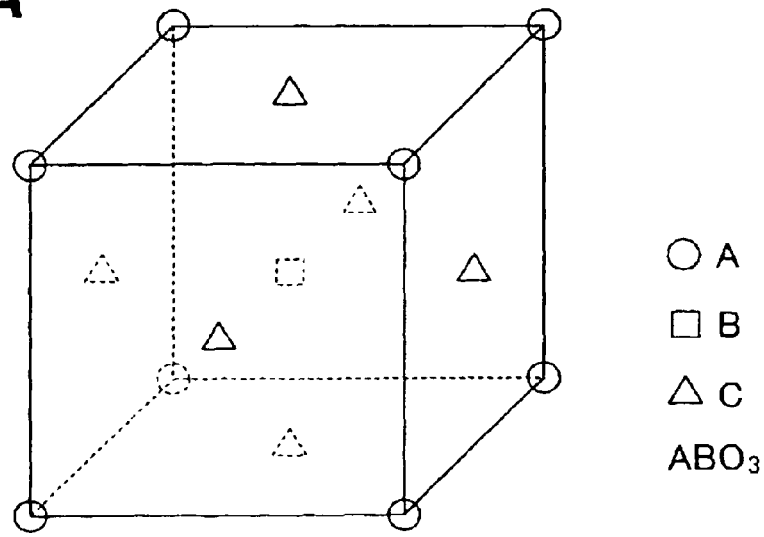
FIGS. 5A to 5E are a schematic perspective view of a crystal structure of an ABO$_3$ type pervskite structure and schematic perspective views illustrating the relation between orientation and polarization.
Figure 5B:
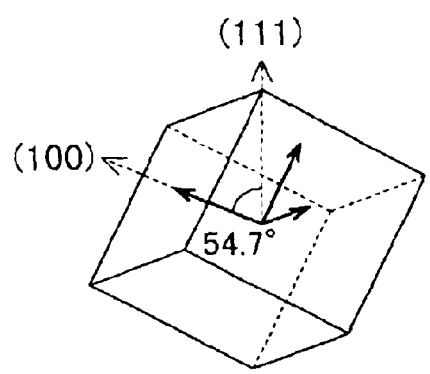
Figure 5C:
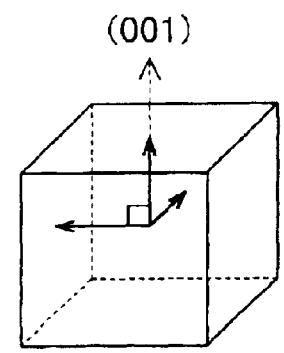

As shown in FIGS. 5B and 5C, the (0 0 1) orientation is an orientation not so effective in the case of orientation of tetragonal PZT. The efficiency of the (1 1 1) orientation is 0.58 whereas that of the (0 0 1) orientation is about ⅓.

PZT having a composition of $0.52 < x \leq 1$ of $PbZr_xTi_{1-x}O_3$ is rhombohedral. The polarization direction of rhombohedral PZT is <1 1 1>.

Figure 5D:
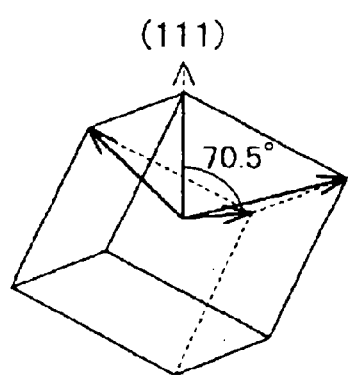
Figure 5E:
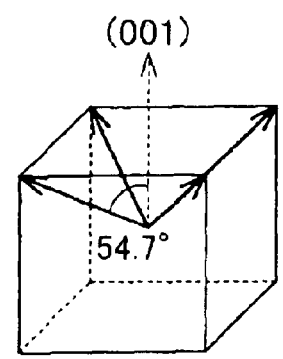

FIGS. 5D and 5E are schematic diagrams illustrating the polarization efficiencies of rhombohedral PZT films which are (1 1 1) and (0 0 1) orientated. The number of <1 1 1> directions is 8. If the positive and negative directions are counted as one direction, the number of <1 1 1> directions is 4.

As shown in FIG. 5D, of four <1 1 1> directions of polarization in a (1 1 1) orientated PZT film, one polarization direction is along the plane normal direction, and the other three polarization directions each have an angle of 70.5 degrees relative to the plane normal direction. The contribution of these four polarizations is $\{1+(\cos 70.5°) \times 3\}/4 = 0.5$.

As shown in FIG. 5E, of four <1 1 1> directions of polarization in a (0 0 1) orientated PZT film, each polarization direction has an angle of 54.7 degrees relative to the <0 0 1> direction. The contribution of these four polarizations is $\cos(54.7°) = 0.58$. The (0 0 1) orientation of rhombohedral PZT can thus provide a high polarization efficiency.

The (0 0 1) orientation is expected even if some additive is mixed with LaNiO$_3$. The (0 0 1) orientation is expected to be formed by using a conductive metal oxide layer of a ABO$_3$ type pervskite structure having the (0 0 1) orientation similar to LaNiO$_3$ and not containing noble metal.

The material of a ferroelectric layer to be formed on an orientated metal oxide layer is not limited only to PZT. If a ferroelectric layer has the pervskite structure and a lattice constant matching the underlying body and formed on an orientated lower electrode, it is expected that the ferroelectric layer can be orientated.

An orientated LaNiO$_3$ film may be formed by sol-gel method, sputtering, laser ablation or pulse laser deposition (PLD), chemical vapor deposition (CVD) or the like. If a heating process at a temperature of 500° C. to 800° C. is included in the film forming process, the (0 0 1) orientation is expected to be obtained.

FIGS. 1A to 1H are schematic cross sectional views illustrating a method of manufacturing a ferroelectric memory element having an LaNiO$_3$ lower electrode according to an embodiment of the invention.

Figure 1A:
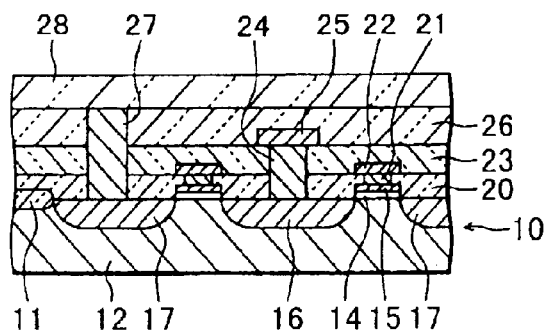
FIGS. 1A to 1H are cross sectional views illustrating manufacture processes for a ferroelectric memory according to an embodiment of the invention.

As shown in FIG. 1A, a semiconductor substrate is prepared which has MOS transistors, conductive plugs and the like. Referring to FIG. 1A, a silicon substrate 10 has n-channel MOS transistor structures formed in a p-type active region 12 defined by an element isolation region 11 of silicon oxide film or the like. A gate electrode 15 of polysilicon or the like is formed on a gate insulating film 14 of silicon oxide or the like. On both sides of the gate electrode 15, n-type source/drain regions 16 and 17 are formed.

An insulating film 20 of silicon oxide or the like is formed covering the gate electrode 15. An opening is formed through the insulating film 20 above each gate electrode, and a tungsten plug 21 is buried in each opening and connected to the gate electrode 15. A wiring line (word line) 22 of aluminum or the like is formed on the tungsten plug 21. An insulating layer 23 of silicon oxide or the like is formed burying the wiring line 22. A contact hole is formed through the insulating layers 23 and 20 above each source region 16 and a tungsten plug 24 is buried in this contact hole. A wiring line 25 of aluminum or the like is formed on the tungsten plug 24.

An insulating layer 26 of silicon oxide or the like is formed burying the wiring line 25. A tungsten plug 27 is buried in a contact hole formed through the insulating layers 26, 23 and 20 above each drain region 17. A protective layer 28 is formed on the insulating layer 26, burying the tungsten plug 27. The protective layer 28 is an insulating film temporarily formed in order to protect the underlying structure. If the processes are to be continuously executed, it is not necessary to form this protective layer. After the structure shown in FIG. 1A is provided, the protective layer 28 is removed.

Figure 1B:
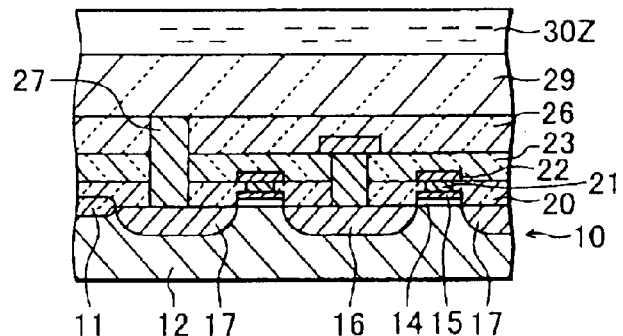

As shown in FIG. 1B, an insulating layer 29 such as lamination of a silicon nitride layer and a silicon oxide layer is formed burying the insulating layer 26 and tungsten plug 27. The surface of the insulating layer 29 is subjected to chemical mechanical polishing (CMP) to planarize it.

As sol-gel source material solution, $La(NO_3)_3 \cdot 6H_2O$ and $Ni(CH_3COO)_2 \cdot 4H_2O$ added with 2-methoxyethanol is used. The source material solution is coated on the surface of the insulating layer 29 to form an $LaNiO_3$ sol-gel source material liquid layer 30Z. After solvent is evaporated, the source material liquid layer is heated for about 10 minutes at 650° C. in an oxygen atmosphere.

Figure 1C:
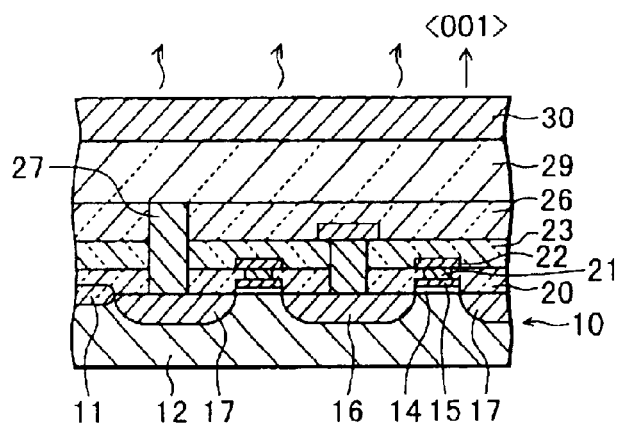

As shown in FIG. 1C, solvent is evaporated from the $LaNiO_3$ sol-gel liquid and chemical reaction proceeds to form an $LaNiO_3$ film 30 which is (0 0 1) orientated.

Figure 1D:
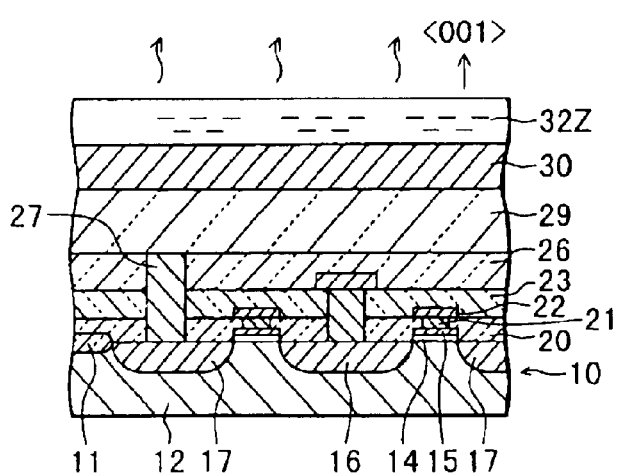

As shown in FIG. 1D, on the $LaNiO_3$ film, a sol-gel source material liquid layer 32Z for $PbZr_{0.65}Ti_{0.35}O_3$ is formed by a sol-gel method. As PZT sol-gel liquid, well-known sol-gel liquid may be used. As the sol-gel liquid layer 32Z is heated for 10 minutes at 650° C. in an oxygen atmosphere, a rhombohedral $PbZr_{0.65}Ti_{0.35}O_3$ film 32 (0 0 1) preferentially orientated in accordance with the (0 0 1) orientation of the underlying body can be formed. $PbZr_xTi_{1-x}O_3$ is rhombohedral at a composition of $0.52<x \leq 1$.

Figure 1E:
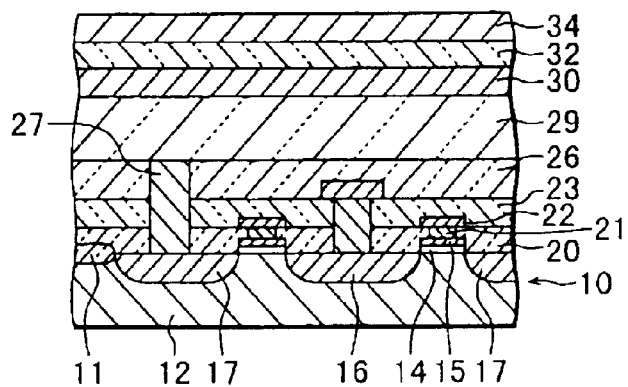

As shown in FIG. 1E, an $LaNiO_3$ film 34 is formed on the (0 0 1) orientated PZT film 32. Since the PZT film 32 is already orientated, the $LaNiO_3$ film to be used as the upper electrode is not necessarily required to be orientated. The upper electrode 34 may be formed by sputtering. Various conductive materials can be used as the upper electrode. It is preferable from the viewpoint of improving the fatigue characteristics that at least one layer of $LaNiO_3$, $IrO_2$, $SrRuO_3$ and the like is formed in contact with the PZT layer.

A resist pattern is formed on the lamination structure to perform a process of patterning the upper electrode 34 and ferroelectric layer 32 and a process of patterning the lower electrode 30. Either one of the two processes may be performed first.

Figure 1F:
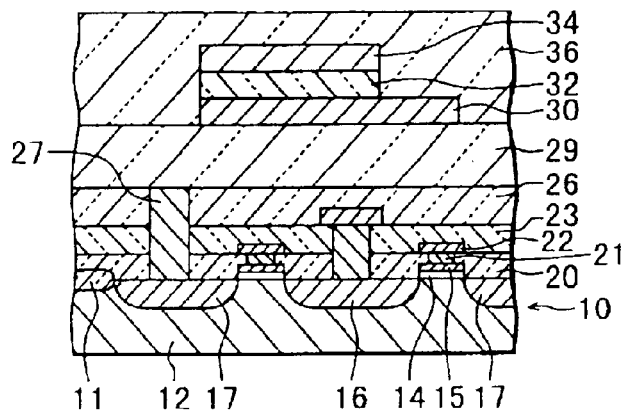

As shown in FIG. 1F, after the capacitor lamination structure 30, 32 and 34 is patterned, an insulating layer 36 of silicon oxide or the like is formed to bury the capacitor lamination structure. If necessary, a planarizing process is executed.

Figure 1G:
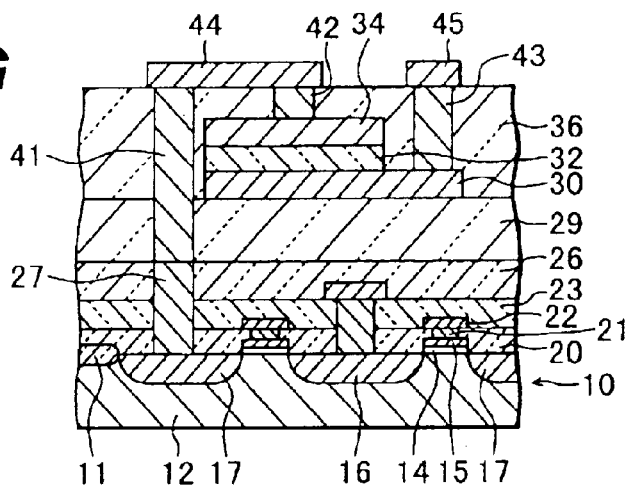

As shown in FIG. 1G, from the surface of the insulating layer 36, an opening reaching the upper electrode 34, an opening reaching the lower electrode 30 and an opening reaching the plug 27 are formed, and tungsten plugs 42, 43 and 41 are buried in the openings. An unnecessary conductive layer on the surface of the insulating layer 36 is removed by CMP or the like. Thereafter, a necessary wiring layer of aluminum or the like is formed to form a wiring pattern 44 interconnecting the tungsten plugs 41 and 42 and a wiring pattern 45 connected to the tungsten plug 43. In this manner, a ferroelectric memory cell is completed.

In the above description, although wiring patterns reaching the upper and lower electrodes are formed from the upper side of the capacitor structure, one wiring pattern may be connected to the lower side of the capacitor structure. An example of this structure will be described.

Figure 1H:
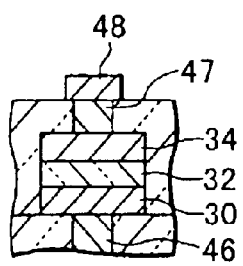

As shown in FIG. 1H, on a conductive plug 46, the lower electrode 30, ferroelectric layer 32 and upper electrode 34 are formed. A plug 47 and a wiring pattern 48 are formed on this capacitor lamination structure so that the wiring lines can be connected to the upper and lower electrodes of the capacitor.

In this embodiment, the PZT ferroelectric layer 32 is preferentially orientated to (0 0 1) in conformity with the (0 0 1) orientation of the underlying $LaNiO_3$ lower electrode 30. A high performance ferroelectric memory can be provided which has a larger polarization amount than a non-orientated PZT film.

Figure 2A:
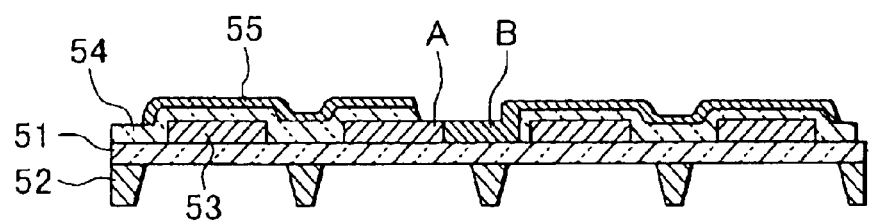
FIGS. 2A and 2B are a cross sectional view of a bulk acoustic wave element and its equivalent circuit diagram, according to another embodiment of the invention.

FIG. 2A is a schematic cross sectional view showing the structure of a bulk acoustic wave (BAW) element. Referring to FIG. 2A, a silicon oxide film 51 is formed on the surface of a silicon substrate 52, and on the surface of this silicon oxide film 51, a lower electrode pattern 53 of (0 0 1) orientated $LaNiO_3$ is formed. A PZT ferroelectric layer 54 is formed covering the lower electrode pattern 53 and an upper electrode 55 is formed on the PZT ferroelectric layer 54. The silicon substrate 52 under the lower electrode pattern 53 is etched and removed. A lower electrode indicated by A is electrically connected to an upper electrode indicated by B.

Figure 3A:
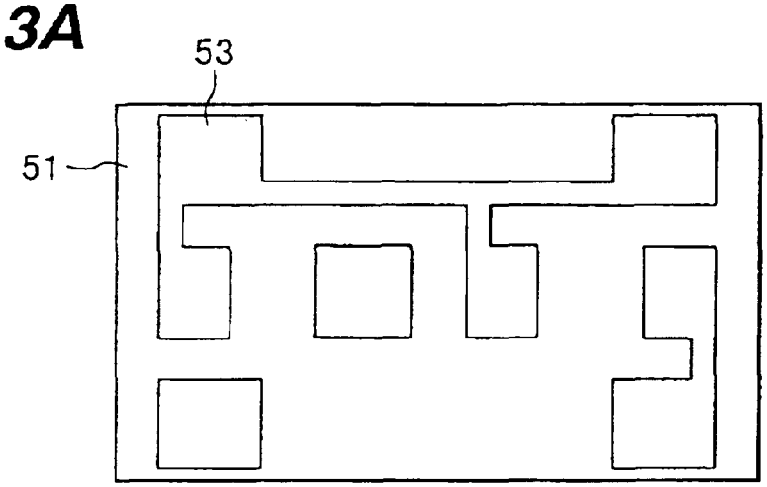
FIGS. 3A to 3C are schematic plan views illustrating manufacture processes for the bulk acoustic wave element shown in FIG. 2A.
Figure 3B:
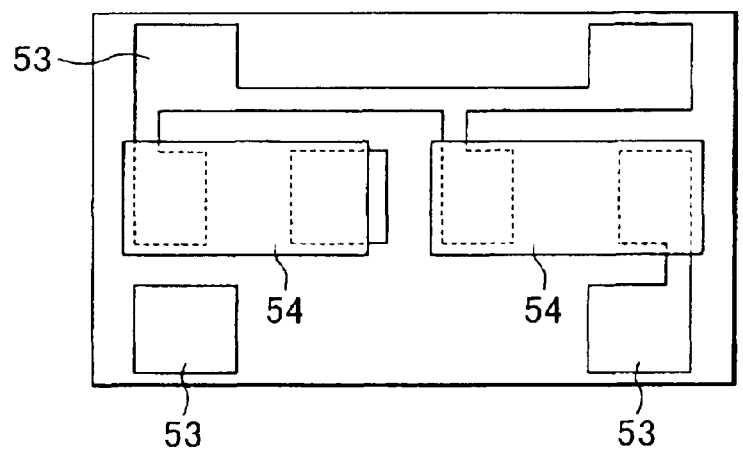
Figure 3C:
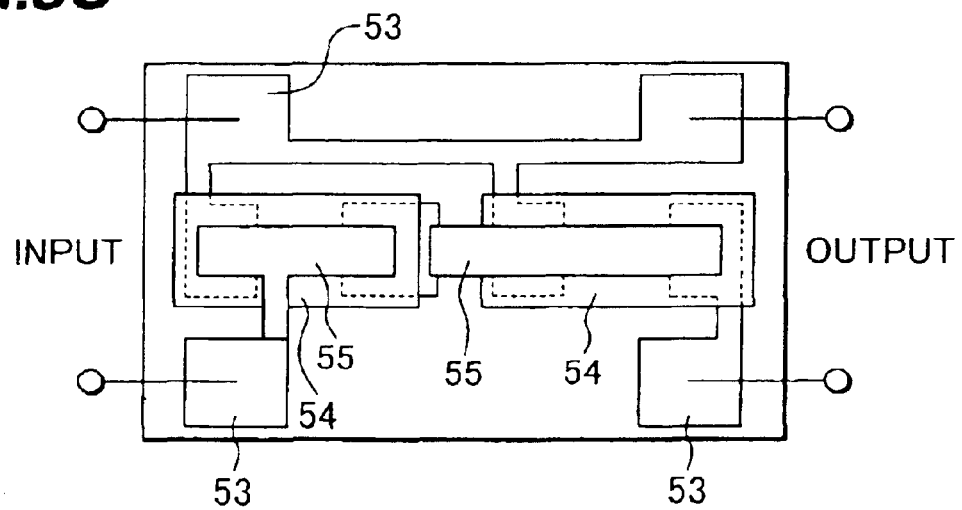

FIGS. 3A, 3B and 3C are schematic plan views illustrating the manufacture processes for the bulk acoustic wave element shown in FIG. 2A.

As shown in FIG. 3A, a substrate formed with a silicon oxide film 51 is heated to about 650° C. and an $LaNiO_3$ film is formed by laser ablation (PLD) and subjected to a heating process for about 10 minutes in an oxygen atmosphere. This heating process preferentially orientates the $LaNiO_3$ film to (0 0 1). A resist pattern is formed on the $LaNiO_3$ film to pattern the $LaNiO_3$ film by dry etching and leave the lower electrode 53.

As shown in FIG. 3B, covering the lower electrode 53, a rhombohedral PZT film is formed by sputtering and heated for 10 minutes at 650° C. in an oxygen atmosphere to preferentially orientate the PZT film to (0 0 1) in conformity with the (0 0 1) orientation of the $LaNiO_3$ film. Thereafter, a resist pattern is formed on the PZT film. The PZT film is etched to leave a pattern 54 of the ferroelectric PZT layer.

As shown in FIG. 3C, an aluminum layer is formed by sputtering and etched by using a resist pattern to leave the upper electrode 55.

Thereafter, the silicon substrate is selectively etched from the bottom side to remove the silicon substrate under the capacitors. In this manner, the BAW filter shown in FIG. 2A can be formed.

Figure 2B:
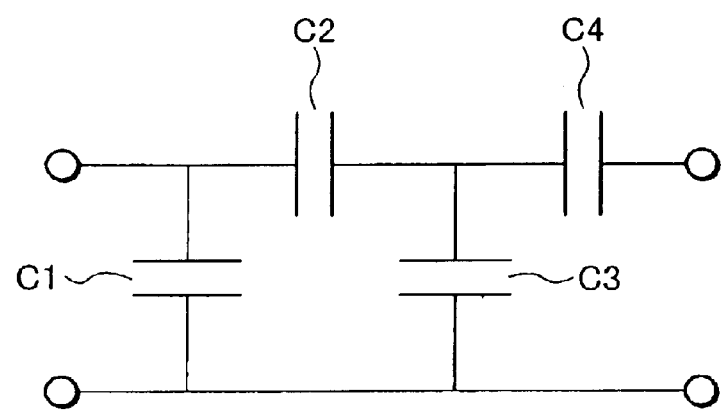

FIG. 2B is an equivalent circuit diagram of a BAW filer formed in the above manner. This equivalent circuit diagram shows capacitors C1, C2, C3 and C4 connected together. The left side is an input side and the right side is an output side.

Figure 4A:
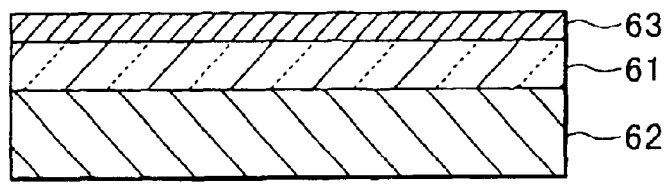
FIGS. 4A to 4D are schematic cross sectional views and a plan view illustrating manufacture processes for a surface acoustic wave element according to another embodiment of the invention.
Figure 4B:
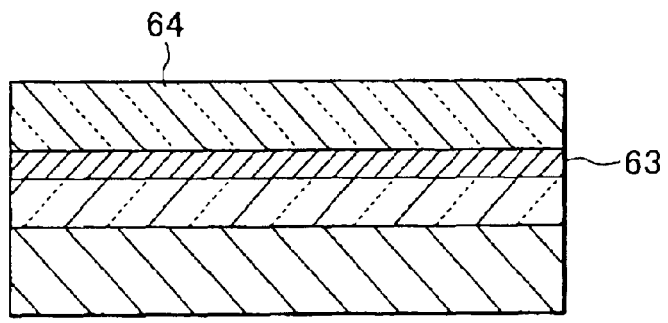
Figure 4C:
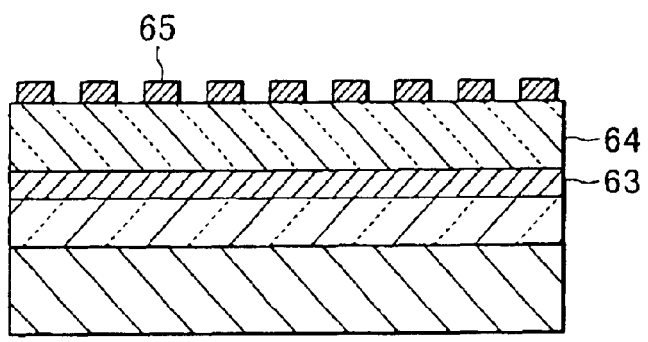
Figure 4D:
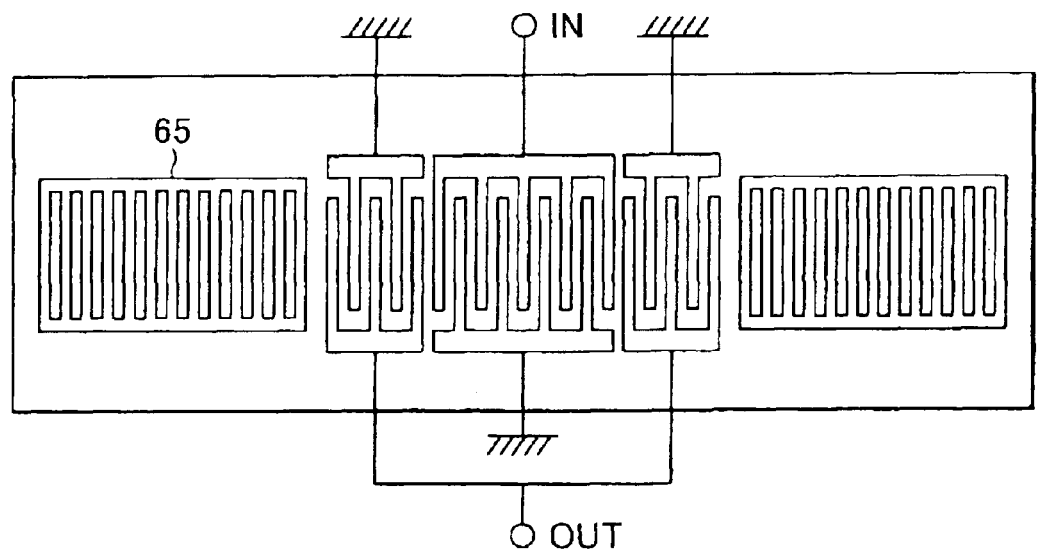

FIGS. 4A to 4C are schematic cross sectional views illustrating the manufacture processes for a surface acoustic wave (SAW) filter according to another embodiment of the invention. FIG. 4D shows a plan view of a SAW.

As shown in FIG. 4A, an LaNiO$_3$ film 63 is formed, by sputtering, on the surface of a silicon wafer 62 formed with a silicon oxide film 61. The LaNiO$_3$ film 63 is preferentially orientated to (0 0 1) by heating it for 10 minutes at 650° C. in an oxygen atmosphere.

As shown in FIG. 4B, a PZT film 64 is formed on the LaNiO$_3$ film 63 by sputtering. The PZT film 64 is preferentially orientated to (0 0 1) in conformity with the (0 0 1) orientation of the underlying film 63, by heating it for 10 minutes at 650° C. in an oxygen atmosphere.

As shown in FIG. 4C, an aluminum film is formed by sputtering and etched by using a resist pattern to leave electrodes 65 of a comb shape or the like.

FIG. 4D is a plan view showing an example of the electrode pattern formed. In this manner, the surface acoustic wave (SAW) filter can be formed.

The present invention has been described in connection with the preferred embodiments. The invention is not limited only to the above embodiments. Although a silicon oxide film is used as the underlying amorphous layer, other insulating layers such as a silicon nitride layer and a silicon oxynitride layer may also be used. Although LaNiO$_3$ is used as the material of an orientated layer, similar orientation is expected to be formed even if an alkali earth metal element such as Sr is added to LaNiO$_3$.

A ferroelectric layer orientated in conformity with the orientation of an underlying orientated layer is not limited only to PZT. PZT added with La (PLZT), PZT added with a group II element such as Ca, Sr and Ba (an addition amount of about 10% or smaller) or the like is expected to be orientated in conformity with the orientation of the underlying LaNiO$_3$ layer, similar to PZT only. Other ferroelectric layers having the pervskite structure may also be used.

A device having capacitor elements is not limited to a nonvolatile memory, a bulk acoustic wave device, and a surface acoustic wave device. Any device may be applied if it has a ferroelectric capacitor. It will be apparent to those skilled in the art that various modifications, improvements, combinations, and the like can be made.

What we claim are:

1. A device comprising:
   an underlying body having a non-orientated first surface;
   a lower electrode formed on the first surface of said underlying body, said lower electrode containing conductive metal oxide and not containing noble metal, the conductive metal oxide having a (0 0 1) orientated ABO$_3$ type verovskite structure;
   a ferroelectric layer formed on said lower electrode, having a rhombohedral ABO$_3$ type perovskite structure, said ferroelectric layer being orientated in conformity with the orientation of said lower electrode; and
   an upper electrode formed on said ferroelectric layer, wherein the first surface is of an amorphous phase.

2. A device according to claim 1, wherein the conductive metal oxide essentially consists of LaNiO$_3$.

3. A device according to claim 2, wherein the conductive metal oxide contains alkali earth metal as additive.

4. A device according to claim 3, wherein the alkali earth metal is Sr.

5. A device according to claim 1, wherein the first surface is made of silicon oxide or silicon nitride.

6. A device according to claim 1, wherein said ferroelectric layer essentially consists of PbZr$_x$Ti$_{1-x}$O$_3$ (0.52<x=1.0).

7. A device according to claim 6, said ferroelectric layer contains as additive at least one element selected from a group consisting of La, Ca, Sr and Ba.

8. A device according to claim 1, wherein said ferroelectric layer is (0 0 1) orientated.

9. A device according to claim 1, wherein said underlying body comprises:
   a silicon substrate;
   a MOS transistor formed on said silicon substrate;
   a first interlayer insulating film formed on said silicon substrate and covering said MOS transistor; and
   a conductive plug formed through said first interlayer insulating film and connected to said MOS transistor,
   wherein said upper or lower electrode is connected to said conductive plug.

10. A device according to claim 9, further comprising a second interlayer insulating film formed on said first interlayer insulating film and covering a ferroelectric capacitor constituted of said upper electrode, said ferroelectric layer and said lower electrode, wherein said lower electrode is formed on said first interlayer insulating film and connected to said conductive plug.

11. A device according to claim 9, further comprising:
   a second interlayer insulating film formed on said first interlayer insulating film and covering a ferroelectric capacitor constituted of said upper electrode, said ferroelectric layer and said lower electrode;
   interconnect conductive plugs formed through or in said second interlayer insulating and reaching said upper electrode, said lower electrode and said conductive plug; and
   wiring lines formed on said second interlayer insulating layer and connected to said interconnect conductive plugs.

12. A device according to claim 1, wherein said lower electrode, said ferroelectric layer and said upper electrode are patterned to collectively form a bulk acoustic wave element.

13. A device according to claim 1, wherein said lower electrode and said ferroelectric layer extend in a broad area and said upper electrode is patterned above said lower electrode and said ferroelectric layer to collectively form a surface acoustic wave element.

14. A device comprising:
   an underlying body having a non-orientated first surface;
   a lower electrode formed on the first surface of said underlying body, said lower electrode containing conductive metal oxide and not containing noble metal, the conductive metal oxide having a (0 0 1) orientated ABO$_3$ type perovskite structure;
   a ferroelectric layer formed on said lower electrode, having a rhombohedral ABO$_3$ type perovskite structure, said ferroelectric layer being orientated in conformity with the orientation of said lower electrode; and
   an upper electrode formed on said ferroelectric layer;
   wherein the first surface is of a polycrystalline phase.

15. A method of manufacturing a device having a capacitor element, comprising steps of:

(a) forming a conductive metal oxide layer on an underlying body having a non-orientated surface, said conductive metal oxide layer having a (0 0 1) orientated $ABO_3$ type perovskite structure;

(b) forming a ferroelectric layer on said conductive metal oxide layer, said ferroelectric layer having a (0 0 1) orientated rhombohedral $ABO_3$ type perovskite structure; and (c) forming an upper electrode on said ferroelectric layer, wherein the first surface is of an amorphous phase.

16. A method of manufacturing a device having a capacitor element according to claim 15, wherein said step (a) includes a step of heating the underlying body at 500 to 800° C. in an oxygen-containing atmosphere.

17. A method of manufacturing a device having a capacitor element according to claim 16, wherein said step (a) performs said heating step after sol-gel source material liquid is coated and solvent is evaporated.

18. A method of manufacturing a device having a capacitor element according to claim 18, wherein the sol-gel source material liquid contains $La(NO_3).6H_2O$ and $Ni(CH_3COO)_2.4H_2O$ added with 2-methoxyethanol.

19. A method of manufacturing a device having a capacitor element according to claim 16, wherein said step (a) performs said heating step after said conductive metal oxide layer is formed by pulse laser deposition (PLD).

* * * * *